United States Patent
Hollis

(10) Patent No.: US 7,098,663 B1
(45) Date of Patent: Aug. 29, 2006

(54) SYSTEMS, METHODS AND APPARATUS OF AN ACTIVELY SHIELDED SUPERCONDUCTING MAGNET DRIFT COMPENSATION COIL

(76) Inventor: Timothy James Hollis, 24 Kestrel Way, Langford Village, Bicester, Oxon (GB) OX26 6YA ( * ) Notice: Subject to any disclaimer, the term of this patent is extended or adjusted under 35 U.S.C. 154(b) by 0 days.

(21) Appl. No.: 11/084,802

(22) Filed: Mar. 18, 2005

(51) Int. Cl.
*G01V 3/00* (2006.01)
(52) U.S. Cl. .................................. 324/320; 335/216
(58) Field of Classification Search ................ 324/320, 324/318; 335/216, 299
See application file for complete search history.

(56) References Cited

U.S. PATENT DOCUMENTS

| | | | | |
|---|---|---|---|---|
| 4,931,735 A | * | 6/1990 | Overweg et al. ........... | 324/318 |
| 6,097,187 A | * | 8/2000 | Srivastava et al. .......... | 324/320 |
| 6,563,316 B1 | * | 5/2003 | Schauwecker et al. ...... | 324/318 |
| 6,727,699 B1 | * | 4/2004 | Kasten ....................... | 324/318 |
| 2002/0101240 A1 | | 8/2002 | Kasten | |

* cited by examiner

*Primary Examiner*—Louis M. Arana

(57) ABSTRACT

Systems, methods and apparatus are provided through which in some embodiments drift of a magnetic field of a magnetic resonance imaging (MRI) system is reduced by including a drift compensation coil which accumulates current at a rate proportional to the decay in the primary coil via its electromagnetic mutual inductance to the primary coil. In some embodiments, the drift compensation coil includes reverse turns at an outer radius, to significantly reduce any exacerbation of the fringe field during a quench of the primary coil. In further embodiments, the actively shielded drift compensation coil is complemented with a non-coupling external disturbance shield coil.

20 Claims, 4 Drawing Sheets

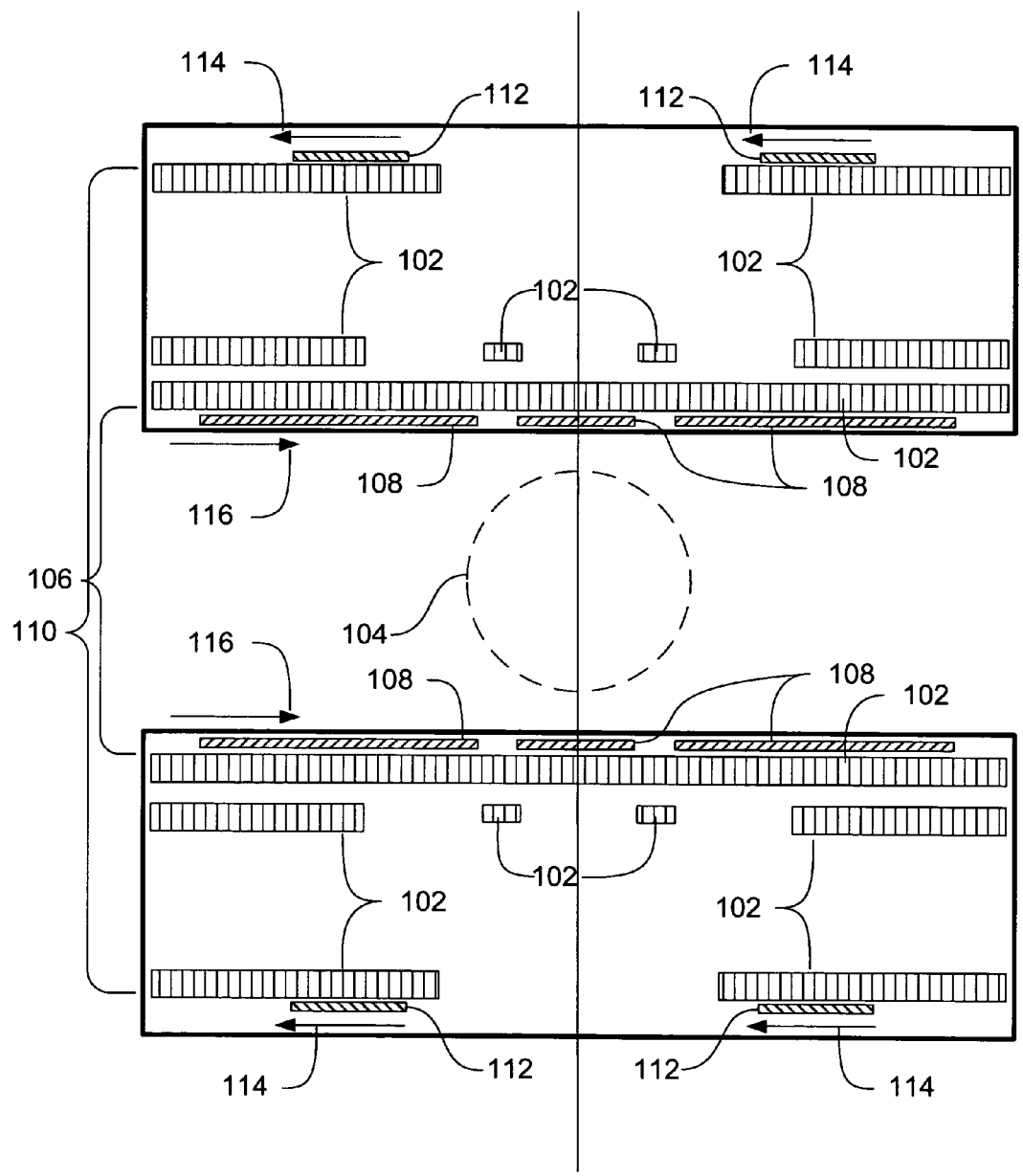
FIG. 1

SYSTEMS, METHODS AND APPARATUS OF AN ACTIVELY SHIELDED SUPERCONDUCTING MAGNET DRIFT COMPENSATION COIL

FIELD OF THE INVENTION

This invention relates generally to generating magnetic fields, and more particularly to modifying generated magnetic fields.

BACKGROUND OF THE INVENTION

Magnetic resonance imaging (MRI) systems use a magnetic field to sense the structure of an object. The structure creates perturbations and variations in the strength in the imaging volume of the magnetic field. The perturbations and variations in the strength of the magnetic field are sensed and interpreted to provide an image of the structure of the object. In many MRI systems, the magnetic field is generated by a superconducting magnet to provide a strong magnetic field. The sensing and interpreting of the magnetic field assumes a magnetic field strength of a particular amount.

Unfortunately, superconducting magnets typically experience a small decay in field strength at a rate of the order of about 0.01 parts per million per hour. Field decay is also known as drift. For a preponderance of superconducting MRI systems, it is necessary to obtain a highly stable non-decaying field in order to properly interpret the magnetic field. Decay in the field strength contributes imprecision to the interpretation of the field, and ultimately, contributes error to the image produced from the magnetic field.

During NMR experiments, protons are detected by subjecting them to a large magnetic field which partially polarize the nuclear spins. The spins are then excited with radio frequency (RF) radiation, and, as they relax, they emit weak radio frequency radiation. The frequency of this radiation is proportional to the magnetic field to which they are subjected.

Spectroscopy and functional imaging (FMRI) are particularly sensitive to field decay. In spectroscopy, line widths approach 1 Hz. To improve the signal to noise ratio, hundreds of spectra, each spaced by a couple of seconds, are added together. Drift of more than 1 Hz over a few minutes, therefore results in a significant loss of resolution. fMRI images are also sensitive to frequency shifts of a few Hz. A 3 Tesla magnet decaying at 0.1 ppm per hour will see a field shift of 0.15 micro Tesla (6 Hz) during a 30 minute scan.

In most conventional MRI systems, the rate of decay is reduced to very low levels by manufacturing the MRI systems with high specification wire and sophisticated joints, which is expensive.

In some conventional MRI systems, the rate of decay is reduced to very low levels by including a secondary coil of appropriate geometry in the MRI system. These secondary coils are also known as drift compensation coils because the secondary coils counteract drift or decay in the strength of the magnetic field. As the current of a primary coil decays over time, the secondary coil conserves flux according to Lens' law and the secondary coil accumulates current. Thus the secondary coil maintains a very stable field in the imaging volume. Such secondary coils can be used to satisfy very low decay rate requirements or simply to retire the risk of field decay as a consequence of minor wire or joint defects in the primary coil. Drift compensation coils are also known as lock coils. Drift compensation coils are typically manufactured from a superconducting material.

Conventional drift compensation coils couple electromagnetically very strongly to the primary coil. Unfortunately, this coupling renders the drift compensation coils prone to extremely high peak induced currents (e.g. ~1000 A) during a quench of the primary coil. For actively shielded magnets, this high current in a drift compensation coil can cause extensive magnetic field bloom which is potentially dangerous and could damage sensitive equipment in the vicinity of the magnet. Magnetic field bloom is an enlarged area of the magnetic field that can extend to areas where the magnetic field is harmful or dangerous to equipment or humans. Magnetic field bloom can cause electrical medical equipment to malfunction and cardiac pacemakers in humans to malfunction. Thus, conventional drift compensation coils can have harmful and dangerous effects that are contradictory to the goals of the healthcare settings in which they operate. Excessive peak induced current in the drift compensation coil may also damage the drift compensation coil.

In conventional MRI systems, the peak induced current caused by coupling between the drift compensation coils and the primary coil can be reduced by forcing the drift compensation coils to quench early. When the primary coil quenches, the drift compensation coil will rapidly accumulate current and, at some point, it will probably quench also because either it reaches the maximum current at which it can remain in a superconducting state, or an increasing Lorentz force produces a wire movement causing frictional heating.

In one example, early quench of the drift compensation coils is achieved by manufacturing the drift compensation coils with coil windings that have low critical current (Lc). Windings are also known as turns. In another example the drift compensation coils are forced to quench early by being fitted with quench heaters driven from the primary coil quench voltages.

Regardless of how early the drift compensation coil is quenched, these coils usually constitute a small number of windings. Thus, drift compensation coils have a low normal electrical resistance and therefore can continue to accumulate current after quenching. Increasing the number of turns increases the electrical resistance in the drift compensation coils and also increases the self inductance of the coil. Both factors tend to reduce the peak induced current in the drift compensation coils. However, inducing a quench of the drift compensation coil at the lower induced current is difficult. In addition, drift compensation coils with increased windings will cause increased fringe field contribution at any given current. If the quench simulations show that the coil continues to accumulate current, even after quenching itself, reducing the cross sectional area of copper in the wire will increase the electrical resistance and in turn reduce current accumulation in the drift compensation coil during a quench. However reducing the cross sectional area of copper in the wire will also reduce the normal current carrying capacity of the wire, resulting in increased risk of quench damage. The cross sectional area of copper in the conductor is the primary factor governing the magnitude of current the wire can carry when in a non-superconducting state.

For the reasons stated above, and for other reasons stated below which will become apparent to those skilled in the art upon reading and understanding the present specification, there is a need in the art for a drift compensation coil in a MRI system that does not cause magnetic field bloom during a quench of the primary coil.

BRIEF DESCRIPTION OF THE INVENTION

The above-mentioned shortcomings, disadvantages and problems are addressed herein, which will be understood by reading and studying the following specification.

In one aspect, an apparatus includes an actively shielded primary coil operable to generate the magnetic field, the primary coil having an inner diameter and an outer diameter, the apparatus also including an actively shielded drift compensation coil with turns positioned near the inner diameter of the primary coil and reverse turns positioned near the outer diameter of the primary coil.

In yet another aspect, an apparatus includes an actively shielded primary coil operable to generate the magnetic field, the primary coil having an inner diameter and an outer diameter, the apparatus also including a non-coupling external disturbance shield coil with turns positioned near the outer diameter of the primary coil and additional turns positioned near the inner diameter of the primary coil.

In yet a further aspect, an apparatus includes a primary coil that is wired in series with a superconducting switch and protection diodes wired in parallel, a drift compensation coil that is wired in series with a superconducting correction coil switch and protection diodes (or resistor) wired in parallel. In some embodiments, the aspect further includes a non-coupling external disturbance shield that is wired in series with a superconducting correction coil switch and protection diodes (or resistor) wired in parallel.

The apparatus reduces decay of the electromagnetic field produced by the apparatus without exacerbating fringe field during a quench of the primary coil. Furthermore, the reduction in fringe field bloom is brought about without having to resort to measures to prevent current accumulation in the drift compensation coil during a quench. With the additional implementation of a non-coupling external disturbance shield coil, the field in the imaging volume is shielded from environmental disturbances in the magnetic field due to nearby moving objects such as elevators, trains, trucks, etc.

Apparatus, systems, and methods of varying scope are described herein. In addition to the aspects and advantages described in this summary, further aspects and advantages will become apparent by reference to the drawings and by reading the detailed description that follows.

BRIEF DESCRIPTION OF THE DRAWINGS

FIG. 1 is a cross section block diagram of apparatus according to an embodiment in which an actively shielded drift compensation coil is positioned near an inner diameter of the primary coil and having reverse wound turns that are positioned near an outer diameter of the primary coil;

DETAILED DESCRIPTION OF THE INVENTION

Figure 2:
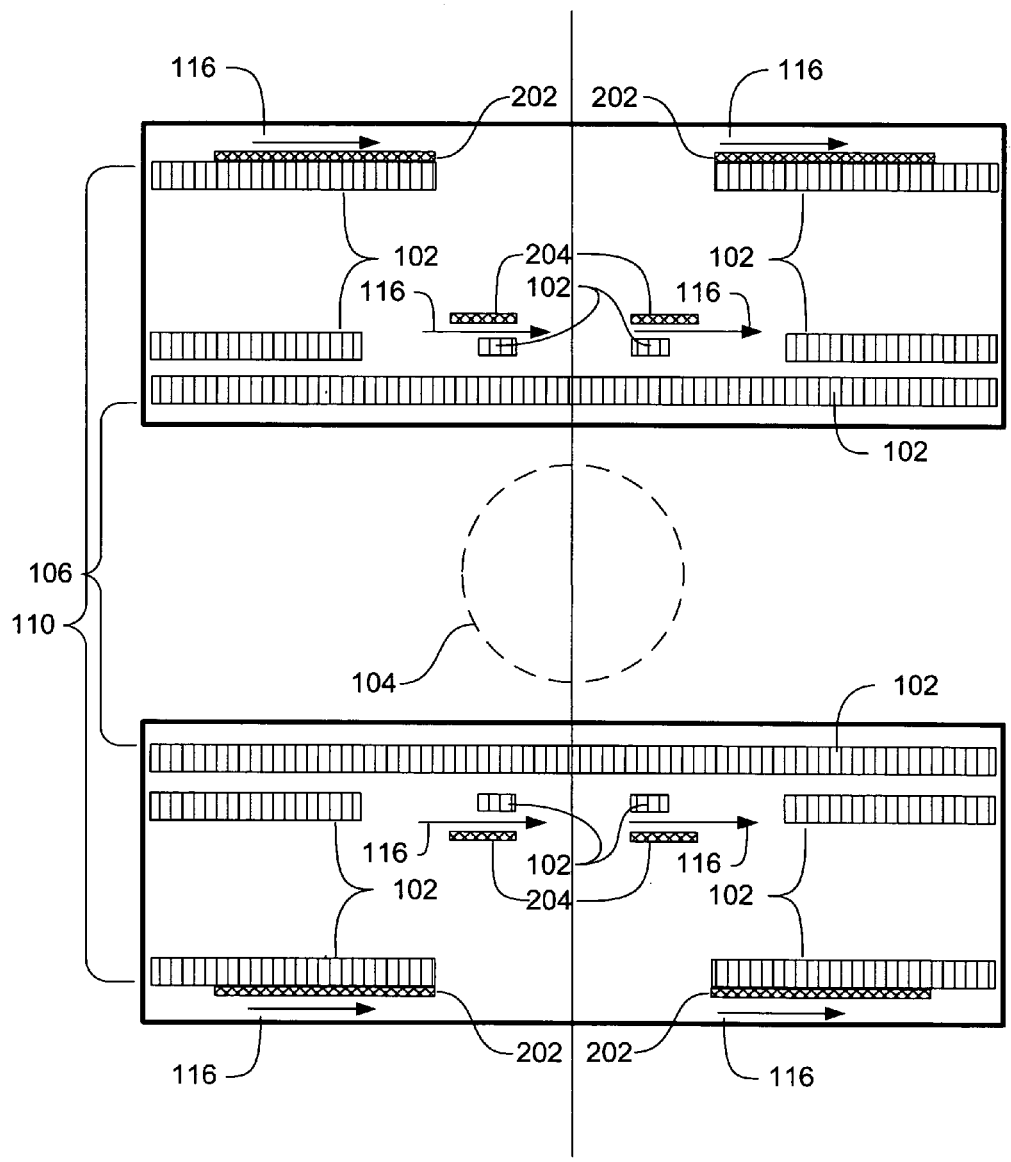
FIG. 2 is a cross section block diagram of apparatus according to an embodiment in which a non-coupling external disturbance shield coil is positioned near an outer diameter of the primary coil and having additional turns, wound in the same direction, positioned near an inner diameter of the primary coil.

In the following detailed description, reference is made to the accompanying drawings that form a part hereof, and in which is shown by way of illustration specific embodiments which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

The detailed description is divided into three sections. In the first section, a system level overview is described. In the second section, apparatus of embodiments are described. Finally, in the third section, a conclusion of the detailed description is provided.

System Level Overview

FIG. 1 is a cross section block diagram of system 100 according to an embodiment in which an actively shielded drift compensation coil is positioned near to an inner diameter of a primary coil with reverse wound turns that are positioned near to an outer diameter of the primary coil. Apparatus 100 solves the need in the art for a drift compensation coil in a magnetic resonance imaging (MRI) system that reduces decay of the magnetic field in the imaging volume, but does not exacerbate fringe field bloom during a quench of the primary coil.

System 100 includes a primary coil 102 operable to generate the homogeneous magnetic field in the imaging volume 104. The primary coil 102 has an inner diameter 106.

System 100 also includes inner turns 108 of a drift compensation coil that counteract decay in the magnetic field due to resistance or "drift" in the primary coil. System 100 shows a specific embodiment of the position of the inner turns 108 of the actively shielded drift compensation coil that are positioned inside the inner diameter 106. System 100 further includes reverse wound outer turns 112 of the drift compensation coil that substantially reduce the fringe field produced by the drift compensation coil.

In some embodiments of system 100, the inner turns 108 of the actively shielded drift compensation coil is a singular drift compensation coil that is not segmented or sub-divided (not shown). In some embodiments, the sub-divided inner turns 108 of the actively shielded drift compensation coil consists of three segments as shown in system 100. In the embodiments of either segmented inner turns 108 of the actively shielded drift compensation coil or a singular actively shielded drift compensation coil (not shown), the geometry of the inner turns 108 of the actively shielded drift compensation coil can be optimized such that low order homogeneity terms are balanced, resulting in negligible homogeneity deterioration over time.

The primary coil 102 also has an outer diameter 110. The drift compensation coil also has one or more reverse wound coils 112 that are positioned near the outer diameter 110 of the primary coil 102. In some embodiments such as that shown in FIG. 1, the actively shielded drift compensation coil 112 is positioned more specifically outside of the outer diameter 110. The outer turns of the actively shielded drift compensation coil 112 that is positioned close to the outer diameter 110 of the primary coil 102 reduce the fringe magnetic field contribution from the drift compensation coil 108.

As referenced above, the actively shielded drift compensation coil 112 has a plurality of turns or windings in an opposite direction 114 to a direction 116 of turns of the inner drift compensation coil 108. The outer turns 112 of the drift compensation coil are either wound or wired in reverse sense relative to the inner turns 108. Thus, if turns 108 are carrying a certain amount of current in a clockwise direction, the outer turns 112 will be carrying the same magnitude of current in the anticlockwise direction. The position and number of turns 112 are optimized in order to minimize the fringe field produced by the inner turns 108 of the drift compensation coil. Therefore, the directions 114 and 116 shown in FIG. 1 are instructive, and not necessarily exemplary. For example, if the direction 116 of turns in the inner portion of the drift compensation coil 108 is notated as +ve, then the direction 114 of turns in the outer portion of the actively shielded drift compensation coil 112 is notated as −ve. Conversely, if the direction 116 of turns in the inner drift compensation coil 108 is notated as −ve, then the direction 114 of outer turns in the actively shielded drift compensation coil 112 is notated as +ve.

Apparatus of an Embodiment

In the previous section, a system level overview of the operation of an embodiment was described. In this section, the particular apparatus of such an embodiment are described by reference to a series of diagrams.

FIG. 2 is a cross section block diagram of optional prior art apparatus 200 according to an embodiment that includes a non-coupling external disturbance shield coil.

In apparatus 200, outer turns 202 of a non-coupling external disturbance coil are positioned near the outer diameter 110 of the primary coil 102. Inner turns 204 of the non-coupling external disturbance shield are positioned near the inner diameter 106 of the primary coil 102.

The non-coupling external disturbance shield coil has a majority of turns in the outer turns 202, with additional turns in the inner turns 204. The outer turns 202 and inner turns 204 are both wound in the same direction 116. The additional turns located in inner turns 204 reduce mutual inductance between the external disturbance shield coil 202 and 204 and the primary coil 102. The non-coupling external disturbance shield coil 202 and 204 is electromagnetically de-coupled to the primary coil 102, which prevents the non-coupling external disturbance shield coil 202 and 204 from experiencing a large induced current during a quench of the primary coil.

The non-coupling external disturbance shield coil differs from the actively shielded drift compensation coil in FIG. 1 in that the outer turns 202 and inner turns 204 are both wound or wired in the same sense relative to each other. Thus if turns 202 are carrying current in a clockwise direction, the inner turns 204 will also be carrying current in the clockwise direction.

Figure 3:
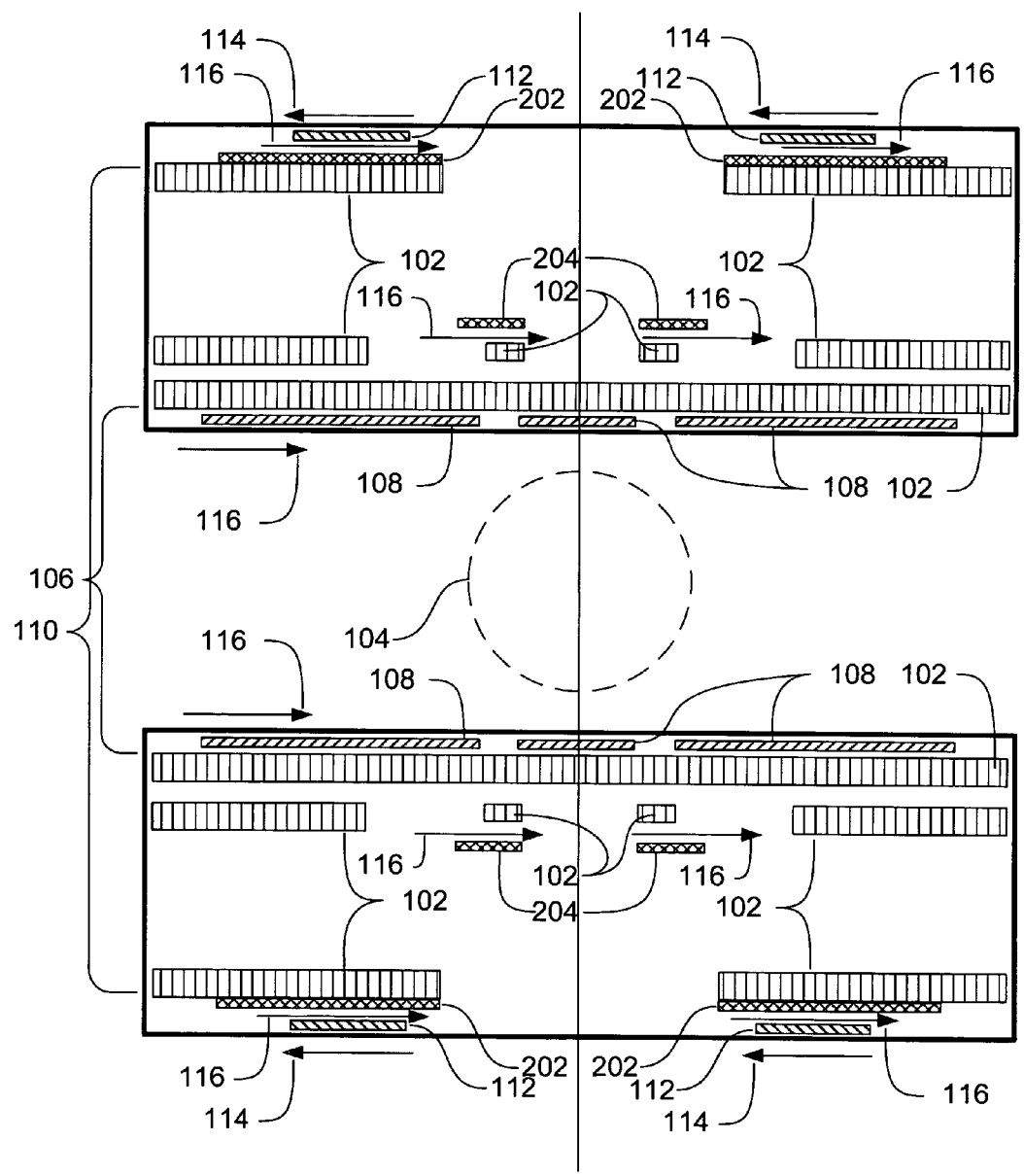
FIG. 3 is a cross section block diagram of apparatus according to an embodiment that includes all aspects of FIGS. 1–2.

FIG. 3 is a cross section block diagram of apparatus 300 according to an embodiment that includes all aspects of FIGS. 1–2. Apparatus 300 provides all of the benefits of system 100 and apparatus 200. An actively shielded primary coil 102 with an actively shielded drift compensation coil 108 and 112 is complemented with a non-coupling external disturbance shield coil 202 and 204. The magnetic field in the imaging volume 104 is compensated against decay in the primary coil 102 and the influence of external disturbances without causing significant magnetic field bloom during a quench of the primary coil 102.

Figure 4:
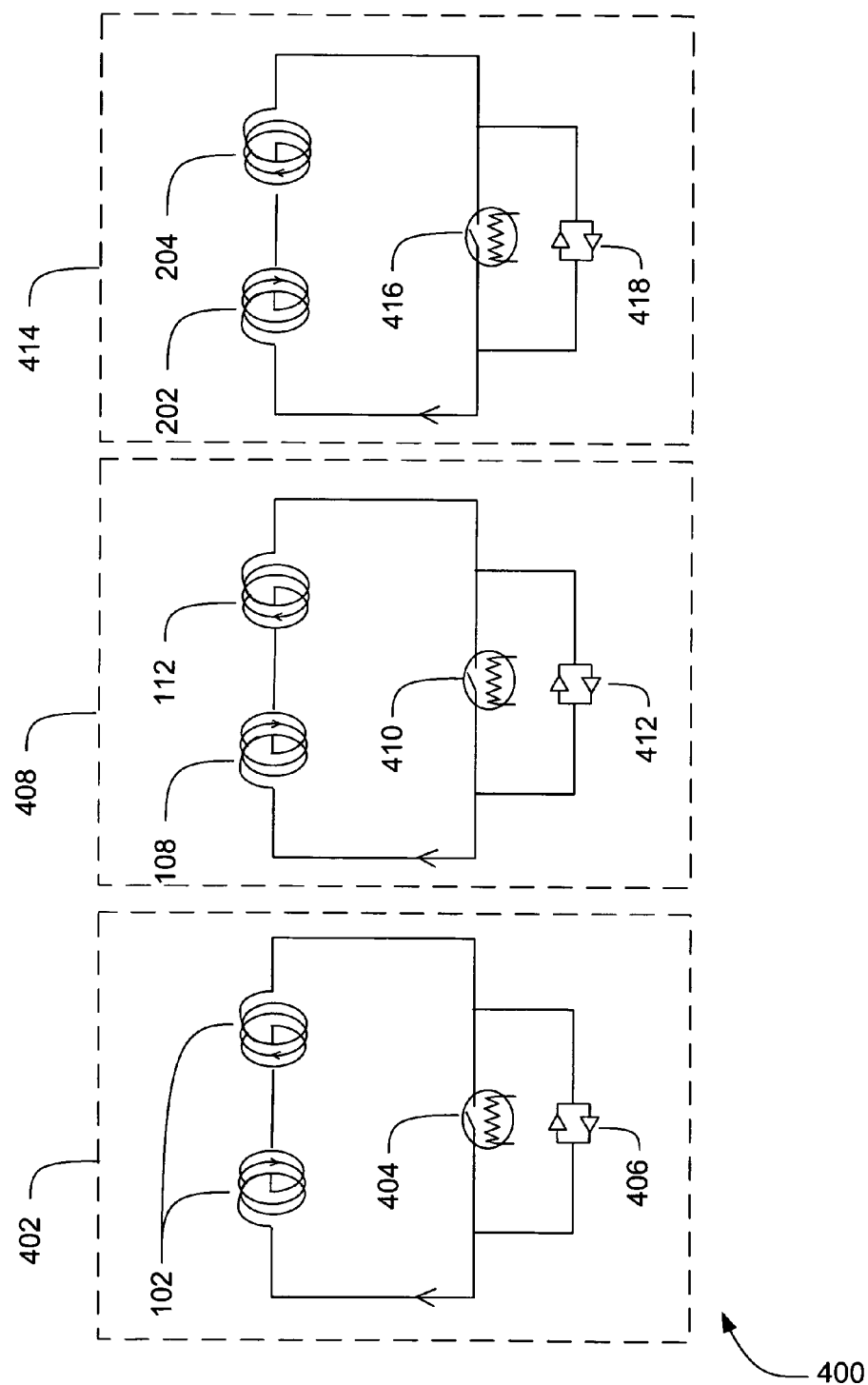
FIG. 4 is a schematic diagram of an apparatus in which three bodies are wired as separate circuits.

FIG. 4 is a schematic diagram of an apparatus 400 in which three bodies are wired as separate circuits.

In a first body 402 of apparatus 400, primary coil 102 is wired in series with a superconducting switch 404 and switch protection diodes 406 wired in parallel. The switch protection diodes 406 limit the voltage across the superconducting switch 404 regardless of how high the current gets across the superconducting switch 404.

In a second body 408, actively shielded drift compensation coils 108 and 112 are wired in series with a superconducting switch 410 and switch protection diodes 412 wired in parallel.

In a third body 414, non-coupling external disturbance shields 202 and 204 are wired in series with a superconducting switch 416 and switch protection diodes 418 wired in parallel.

In some embodiments, one or more switch protection diodes 406, 412 or 418 are replaced by resistors.

CONCLUSION

A magnetic resonance imaging system having reduced magnetic drift without exacerbated fringe field bloom is described. Although specific embodiments are illustrated and described herein, it will be appreciated by those of ordinary skill in the art that any arrangement which is calculated to achieve the same purpose may be substituted for the specific embodiments shown. This application is intended to cover any adaptations or variations.

In particular, one of skill in the art will readily appreciate that the names of the methods and apparatus are not intended to limit embodiments. Furthermore, additional methods and apparatus can be added to the components, functions can be rearranged among the components, and new components to correspond to future enhancements and physical devices used in embodiments can be introduced without departing from the scope of embodiments. One of skill in the art will readily recognize that embodiments are applicable to future MRI devices and new primary coils.

The terminology used in this application is meant to include all environments are alternate technologies which provide the same functionality as described herein.

I claim:

1. An apparatus having minimal decay of a magnetic field, the apparatus comprising:
   a primary coil operable to generate the magnetic field, the primary coil having an inner diameter and an outer diameter;
   an actively shielded drift compensation coil with turns positioned near the inner diameter of the primary coil and with turns positioned near the outer diameter of the primary coil; and
   a non-coupling external disturbance shield coil with turns positioned near the outer diameter of the primary coil and with turns positioned near the inner diameter of the primary coil.

2. The apparatus of claim 1, wherein the turns of the actively shielded drift compensation coil positioned near the inner diameter of the primary coil further comprise:
   turns positioned inside the inner diameter of the primary coil.

3. The apparatus of claim 1, wherein the turns of the actively shielded drift compensation coil positioned near the outer diameter of the primary coil further comprise:

turns positioned inside the outer diameter of the primary coil.

4. The apparatus of claim 1, wherein the turns of the actively shielded drift compensation coil positioned near the inner diameter of the primary coil further comprise:
turns positioned inside the inner turns of the non-coupling external disturbance shield coil.

5. The apparatus of claim 1, wherein the inner turns of the actively shielded drift compensation coil positioned near the inner diameter of the primary coil further comprise:
turns positioned outside the inner turns of the non-coupling external disturbance shield coil.

6. The apparatus of claim 1, wherein the turns of the actively shielded drift compensation coil positioned near the outer diameter of the primary coil further comprise:
positioned inside the outer turns of the non-coupling external disturbance shield coil.

7. The apparatus of claim 1, wherein the turns of the actively shielded drift compensation coil positioned outside the outer diameter of the primary coil further comprise:
positioned outside the inner turns of the non-coupling external disturbance shield coil.

8. An apparatus having minimal decay of a magnetic field, the apparatus comprising:
a first body comprising a primary coil wired in series with a superconducting switch and switch protection diodes wired in parallel;
a second body comprising a plurality of drift compensation coils wired in series with a superconducting switch and switch protection diodes wired in parallel; and
a third body comprising a plurality of non-coupling external disturbance shields wired in series with a superconducting switch and switch protection diodes wired in parallel.

9. The apparatus of claim 8, wherein the at least one set of switch protection diodes are replaced by switch protection resistors.

10. The apparatus of claim 8, wherein the primary coil further comprises an inner diameter and an outer diameter and each of the actively shielded drift compensation coils further comprise:
turns positioned near the inner diameter of the primary coil; and
turns positioned near the outer diameter of the primary coil.

11. The apparatus of claim 8, wherein the primary coil further comprises an inner diameter and an outer diameter and each of the non-coupling external disturbance shield coils further comprise:

turns positioned near the inner diameter of the primary coil; and
turns positioned near the outer diameter of the primary coil.

12. The apparatus of claim 8, wherein the plurality of drift compensation coils further comprise:
two drift compensation coils.

13. The apparatus of claim 8, wherein the plurality of non-coupling external disturbance shields further comprise:
two non-coupling external disturbance shields.

14. The apparatus of claim 8, wherein the second body further comprises:
a segmented second body.

15. The apparatus of claim 8, wherein the plurality of non-coupling external disturbance shields further comprises:
a plurality of non-coupling external disturbance shields positioned near the outer diameter of the primary coil, with additional turns positioned near the inner diameter of the primary coil.

16. The apparatus of claim 8, wherein the first body, the second body and the third body are wired as separate circuits.

17. The apparatus of claim 8, wherein the apparatus further comprises:
a magnetic resonance imaging system.

18. The apparatus of claim 8, wherein the apparatus further comprises:
a medical magnetic resonance imaging system.

19. The apparatus of claim 8, wherein the apparatus further comprises:
an apparatus that has reduced decay of a magnetic field in a imaging volume, but does not exacerbate fringe field bloom during a quench of the first body.

20. The apparatus of claim 8, wherein the apparatus further comprises:
an apparatus that is operable to produce a magnetic field in an imaging volume that is compensated against decay in the primary coil first body and the influence of external disturbances without causing significant magnetic field bloom during a quench of the first body.

* * * * *